US005557132A

United States Patent [19]

Takahashi

[11] Patent Number: 5,557,132

[45] Date of Patent: Sep. 17, 1996

[54] SEMICONDUCTOR RELAY UNIT

[75] Inventor: Masazi Takahashi, Tokyo, Japan

[73] Assignee: NEC Corporation, Tokyo, Japan

[21] Appl. No.: 354,102

[22] Filed: Dec. 6, 1994

[30] Foreign Application Priority Data

Dec. 8, 1993 [JP] Japan .................................... 5-308238

[51] Int. Cl.[6] ............................ H01L 29/82; H01H 51/22

[52] U.S. Cl. .......................... 257/415; 257/422; 257/686; 257/689; 335/78; 335/80; 361/819

[58] Field of Search .................................... 257/415, 421, 257/422, 428, 666, 678, 686, 690, 734, 689; 361/160, 206, 819; 335/202, 78, 79, 80, 81, 83, 84, 82, 85, 86, 124, 128

[56] References Cited

U.S. PATENT DOCUMENTS 5,126,709 6/1992 Tanaka et al. ............................ 335/80
5,148,136 9/1992 Kidd ........................................ 335/78

FOREIGN PATENT DOCUMENTS 1-292725 11/1989 Japan .

*Primary Examiner*—Minhloan Tran
*Attorney, Agent, or Firm*—Popham, Haik, Schnobrich & Kaufman, Ltd.

[57] ABSTRACT

A silicon substrate is partially removed for forming a movable center portion connected through torsional portions to a stationary portion, and current flows through a coil formed in the movable center portion so that a moving contact formed in the torsional portion comes into contact with a fixed point.

9 Claims, 11 Drawing Sheets

SEMICONDUCTOR RELAY UNIT

FIELD OF THE INVENTION

This invention relates to a semiconductor relay unit and, more particularly, to a semiconductor relay having a moving contact formed on a semiconductor deformable area.

DESCRIPTION OF THE RELATED ART

A conventional solenoid-operated relay unit is implemented by an electromagnet and moving and fixed contacts, and the moving contact attracted to the fixed contact in a magnetic field created by the electromagnet. The solenoid-operated relay unit is incorporated in a communication system, a measuring instrument and an industrial equipment.

The conventional solenoid-operated relay unit is so bulky that a miniaturization is requested by the user. A miniature relay unit is disclosed in Japanese Patent Publication of Unexamined Application No. 1-292725, and the miniature relay unit is illustrated in FIG. 1 of the drawings. The prior art miniature relay unit comprises a printed board 1, an iron core 2, a spring member 3 of magnetic substance and a plurality of terminals 4*a* to 4*e*. Two rectangular through holes 1*a* and 1*b* are formed in the printed board 1, and a coil 5 is printed around the rectangular through holes 1*a* and 1*b*. Fixed contacts 6*a* and 6*b* are formed on both surfaces of the printed board 1, and moving contacts 7*a* and 7*b* are provided on bifurcated portions 3*a* and 3*b* of the spring member 3. Between the fixed contacts 6*a* and 6*b* and the rectangular though hole 1*a* is further formed a rectangular window 1*c* which allows the bifurcated portion 7*b* to pass therethrough.

Two projections 2*a* and 2*b* of the iron core member 2 are respectively inserted into the rectangular through holes 1*a* and 1*b*, and the boss portion 3*c* of the spring member 3 is fixed to the projection 2*b*. One of the bifurcated portions 7*b* passes through the rectangular window 1*c*, and the moving contacts 7*a* and 7*b* are associated with the fixed contacts 6*a* and 6*b*, respectively.

When current is supplied to the printed coil 5, the spring member 3 is attracted to the iron core member 2, and the moving contacts 7*a* and 7*b* are complementarily brought into contact and spaced from the fixed contacts 6*a* and 6*b*, respectively.

However, the manufacturer needs to individually produce the parts of the prior art miniature relay unit such as, for example, the printed board 1, the iron core 2 and the spring member 3, and the parts are assembled into the prior art miniature relay unit. For this reason, the prior art miniature relay unit fabricated through the complex process is low in productivity, and is, accordingly, expensive.

SUMMARY OF THE INVENTION

It is therefore an important object of the present invention to provide a semiconductor relay unit which is high in productivity.

To accomplish the object, the present invention proposes to fabricate a relay unit on a semiconductor substrate by using conventional semiconductor technologies.

In accordance with the present invention, there is provided a semiconductor relay unit comprising: a first semiconductor substrate having a stationary portion and a movable portion movable with respect to the stationary portion; a coil means at least a part of which is formed in the movable portion; a moving contact means formed in the movable portion; a fixed contact portion provided over the first semiconductor substrate and associated with the moving contact means; a magnet means provided on the stationary portion, and creating a magnetic field around the coil means; and a current supplying means operative to supply a current to the coil means for exerting a magnetic force to the movable portion, thereby causing the movable portion to move with respect to the stationary portion for bringing the moving contact means into contact with the fixed contact means.

BRIEF DESCRIPTION OF THE DRAWINGS

The feature and advantages of the semiconductor relay unit according to the present invention will be more clearly understood from the following description taken in conjunction with the accompanying drawings in which.

DESCRIPTION OF THE PREFERRED EMBODIMENTS

First Embodiment

Figure 1:
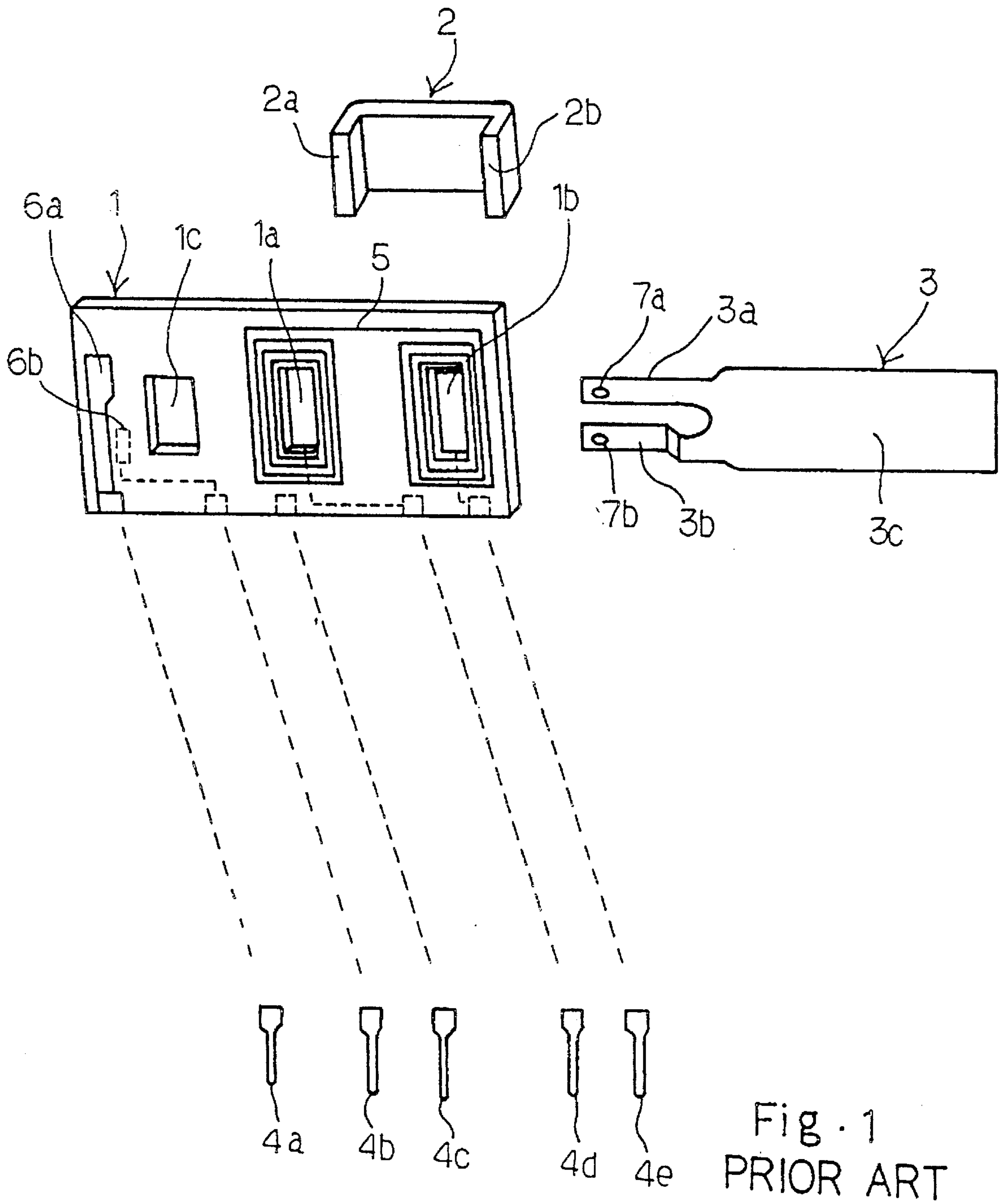
Fig. 1 PRIOR ART
FIG. 1 is a fragmentary perspective view showing the prior art miniature relay unit.
Figure 2:
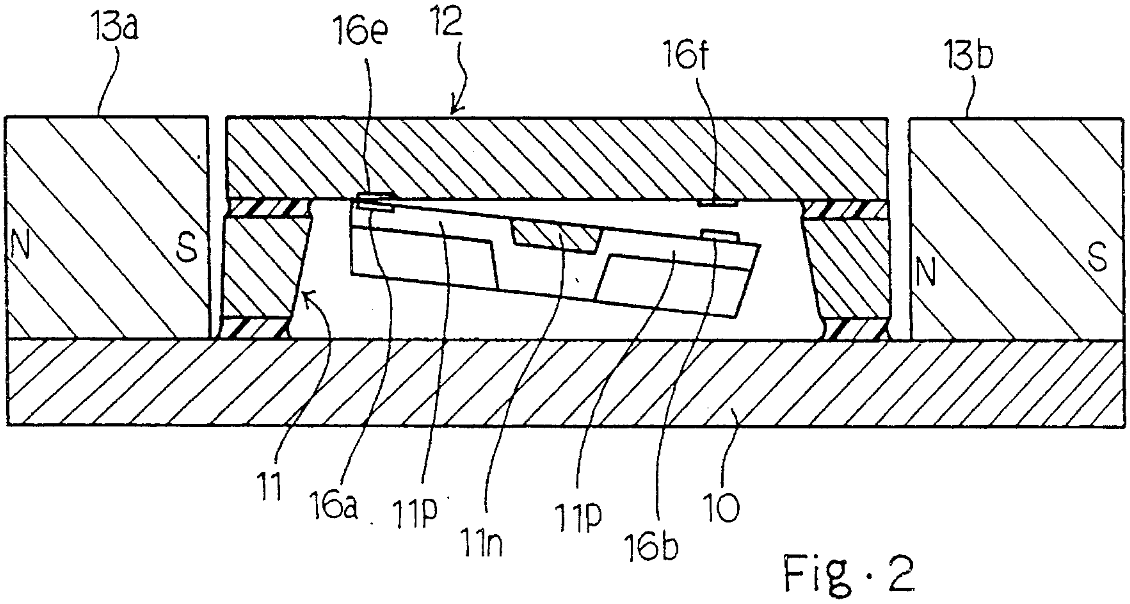
FIG. 2 is a cross-sectional view showing the structure of a semiconductor relay unit according to the present invention.
Figure 3:
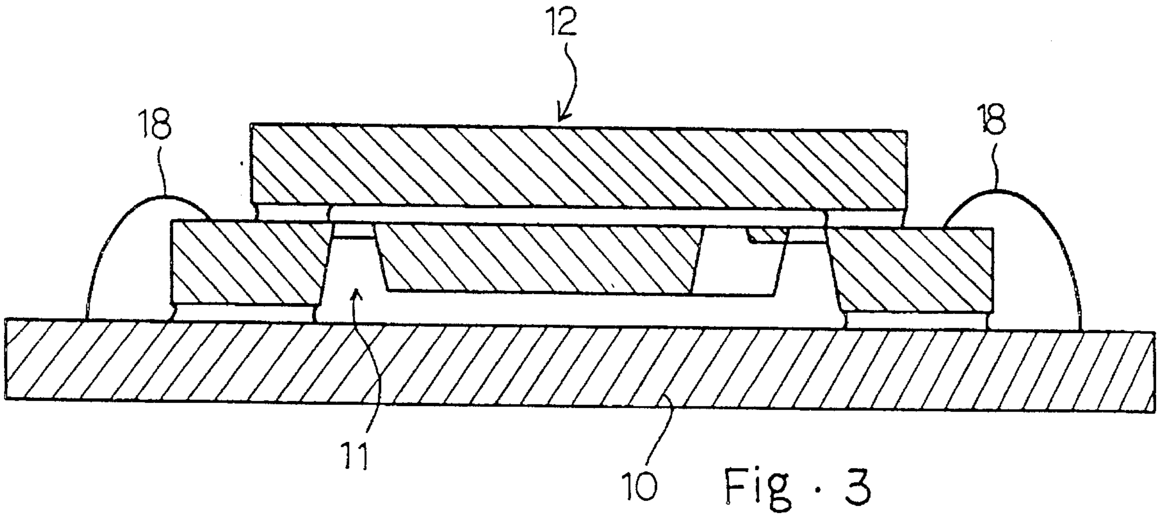
FIG. 3 is a cross sectional view showing the structure of the semiconductor relay unit taken along a different cross section from FIG. 2.

Referring first to FIGS. 2 and 3 of the drawings, a semiconductor relay unit embodying the present invention is mounted on a lead frame 10, and largely comprises a first silicon substrate 11 for moving contacts, a second silicon substrate 12 for fixed contacts and bonded to the first silicon substrate 11 and a pair of permanent magnet blocks 13*a* and 13*b* provided on the lead frame 10 on both sides of the first and second silicon substrates 11 and 12. Although the semiconductor relay unit is molded in a package, the package is not illustrated in the figures.

Figure 4:
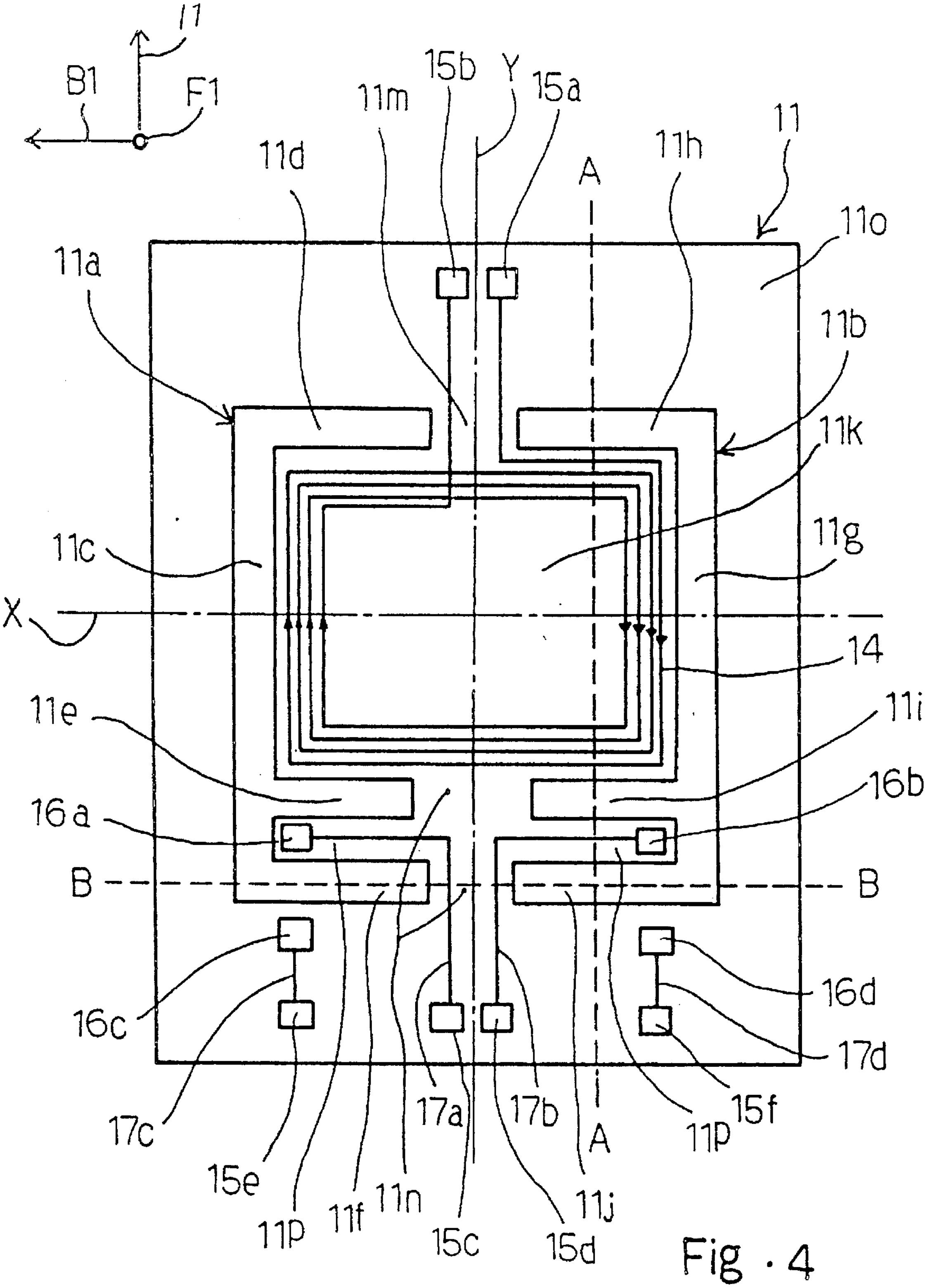
FIG. 4 is a plan view showing the layout of a first semiconductor substrate for forming moving contacts incorporated in the semiconductor relay unit.
Figure 5:
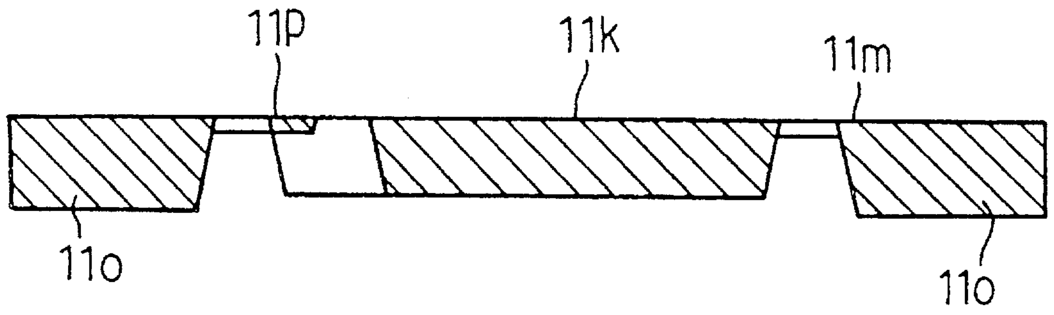
FIG. 5 is a cross sectional view taken along line A—A of FIG. 4.
Figure 6:
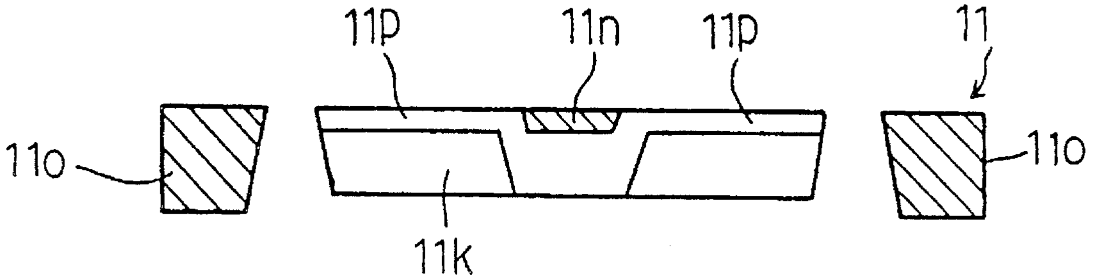
FIG. 6 is a cross sectional view taken along line B—B of FIG. 4.

The first silicon substrate 11 is illustrated in detail in FIGS. 4, 5 and 6. The first silicon substrate 11 is rectangular, and semiconductor process technologies are applied to the first silicon substrate 11 as follows. In the first silicon substrate 11 are formed two slits 11*a* and 11*b* which are symmetrical with respect to a center line Y. The slits 11*a* and 11*b* are formed through an anisotropic etching process. The slit 11*a* has a straight portion 11*c* and three projecting portions 11*d*, 11*e* and 11*f*, and the other slit 11*b* is also constituted by a straight portion 11*g* and three projecting portions 11*h*, 11*i* and 11*j*. The projecting portions 11*d* and 11*e* are confronted with the projecting portions 11*h* and 11*i*, and the projecting portions 11*d*, 11*e*, 11*h* and 11*i* and the straight portions 11*c* and 11*g* define a movable center portion 11*k* connected through torsional portions 11*m* and 11*n* to a stationary frame portion 11*o*. The torsional portions 11*m* and 11*n* are thinner than the movable center portion 11*k*. The torsional portion 11*n* between the projecting portions 11*e*/11*i* and the projecting portions 11*f*/11*j* is wider, and serves as a deformable contact portion 11*p*.

A spiral coil 14 is formed in the movable center portion 11*k*, and is connected at both ends thereof to bonding pads 15*a* and 15*b*. The spiral coil 14 is implemented by using ion-implantation or a deposition of conductive metal followed by an etching.

Two moving contacts 16*a* and 16*b* are formed on the deformable contact portion 11*p*, and are connected through wirings 17*a* and 17*b* to bonding pads 15*c* and 15*d*. The moving contact may be formed through the same process as the spiral coil 14.

On the stationary frame portion 11*o* are formed first intermediate contacts 16*c* and 16*d* which are connected through wirings 17*c* and 17*d* to bonding pads 15*e* and 15*f*. The contacts 16*a* to 16*d* and the wirings 17*a* to 17*d* may be formed by using the same process as the spiral coil 14.

Figure 7:
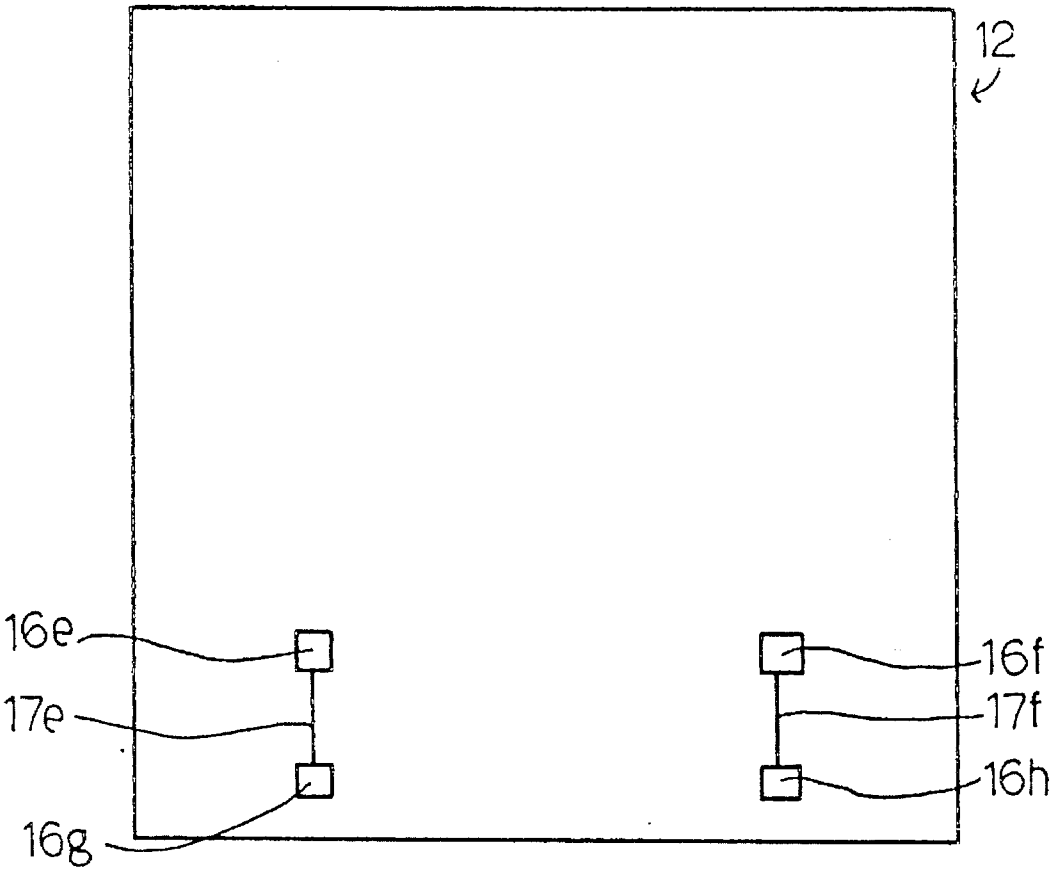
FIG. 7 is a plan view showing the layout of a second semiconductor substrate for forming fixed contacts incorporated in the semiconductor relay unit.
Figure 8:
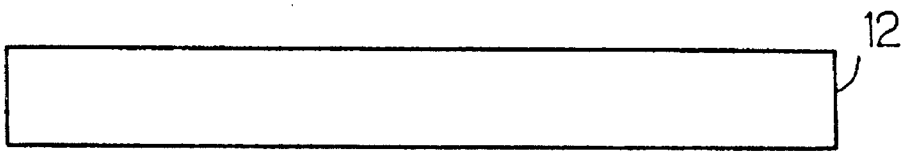
FIG. 8 is a front view showing the second semiconductor substrate.
Figure 9:
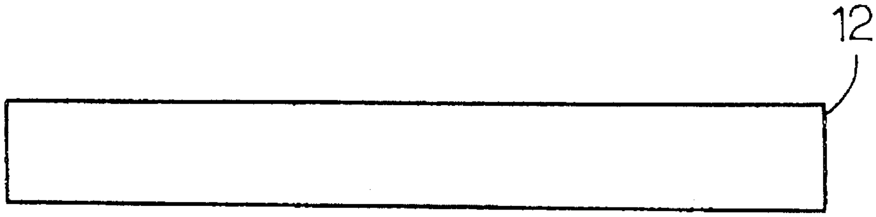
FIG. 9 is a side view showing the second semiconductor substrates.

Turning to FIGS. 7, 8 and 9, the second silicon substrate 12 is also rectangular, and fixed contacts 16*e* and 16*f* are formed on the second silicon substrate 12, and are connected through wirings 17*e* and 17*f* to second intermediate contacts 16*g* and 16*h*. The fixed contacts 16*e* and 16*f*, the second intermediate contacts 16*g* and 16*h* and the wirings 17*e* and 17*f* are formed through an ion-implantation or a deposition of a conductive metal followed by an etching process.

In an assembling stage, the second silicon substrate 12 is positional relative to the first silicon substrate 11 in such a manner that the moving contacts 16*a* and 16*b* are faced to the fixed contacts 16*e* and 16*f*, and are bonded to the second silicon substrate 12. The first intermediate contacts 16*c* and 16*d* are held in contact with the second intermediate contacts 16*g* and 16*h*, and the bonding pads 15*e* and 15*f* are electrically connected through the wirings 17*c*/17*d*, the first intermediate contacts 16*c*/16*d*, the second intermediate contacts 16*g*/16*h* and the wirings 17*e*/17*f* to the fixed contacts 16*e*/16*f*. The bonding pads 15*a*, 15*b*, 15*c*, 15*d*, 15*e* and 15*f* are connected through bonding wires 18 to the lead frame 10 (see FIG. 3).

The semiconductor relay unit shown in FIGS. 2 and 3 behaves as follows. When driving current is supplied from the lead frame 10 through the bonding wire 18 and the bonding pad 15*a* to the spiral coil 14, the current flows in one direction on the right side of the center line Y and in the opposite direction on the left side of the center line Y. The permanent magnet blocks 13*a* and 13*b* create a magnetic field in parallel to the spiral coil 14, and magnetic force is exerted on the movable central portion 11*k*. As taught by Flemming's left hand rule, the magnetic force exerted on the right side is opposite to the magnetic force external on the left side, and a torque is produced around the center line Y. Arrows I1, B1 and F1 are indicative of the direction of current, the direction of the magnetic field and the direction of the magnetic force. However, a torque is not produced around a center line X perpendicular to the center line Y, because the direction of the current is matched with the magnetic field.

The torsional portions 11*m* and 11*n* are deformed due the torque as shown in FIG. 2, and the moving contact 16*a* comes into contact with the fixed contact 16*e*. If the current flows vice versa, the moving contact 16*b* comes into contact with the other fixed contact, 16*f*, and the moving contact 16*a* leaves the fixed contact 16*e*.

As will be appreciated from the foregoing description, the semiconductor relay unit is fabricated by using the semiconductor process technologies. A large number of semiconductor relay units are concurrently completed on semiconductor wafers, and the semiconductor wafers are separated into the semiconductor relay units. Thereafter, the semiconductor relay unit is assembled with the lead frame 10 and the permanent magnet blocks 13*a*/13*b*. Thus, the semiconductor relay unit according to the present invention is higher in productivity than the prior art miniature relay unit, and is lower in price than that.

Second Embodiment

Figure 10:
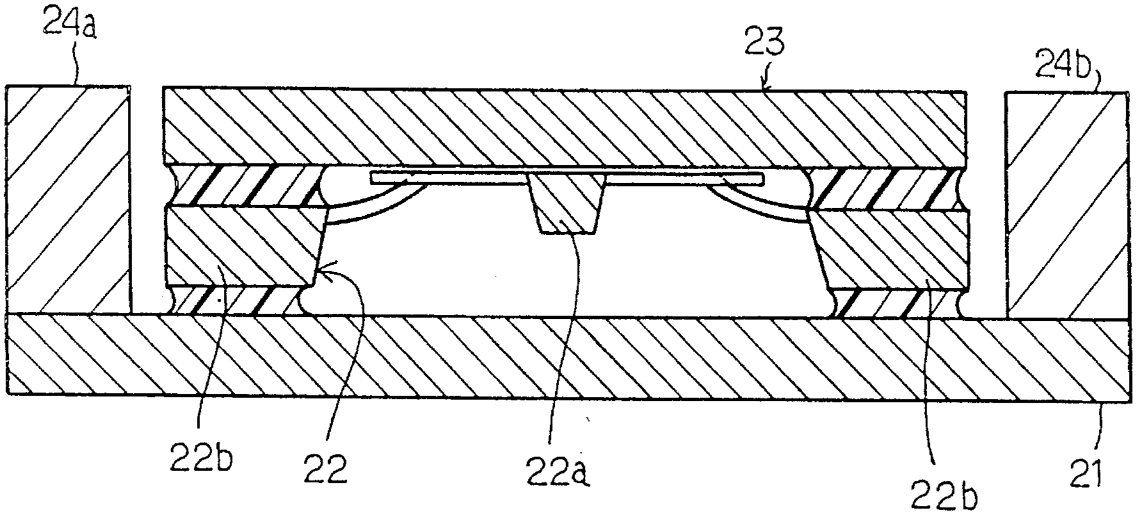
FIG. 10 is a cross sectional view showing the structure of another semiconductor relay unit according to the present invention.

Turning to FIG. 10 of the drawings, another semiconductor relay unit is mounted on a lead frame 21, and is sealed in a package (not shown) as similar to the first embodiment. The semiconductor relay unit implementing the second embodiment comprises a first semiconductor substrate 22 bonded to the lead frame 21, a second semiconductor substrate 23 bonded to the first semiconductor substrate and permanent magnet blocks 24*a* and 24*b* provided on both sides of the first and second semiconductor substrates 22 and 23. A difference of the first semiconductor substrate 22 from the second semiconductor substrates 23 is a slit pattern which allows a movable center portion 22*a* to move in the up-and-down direction as described hereinbelow.

Figure 11:
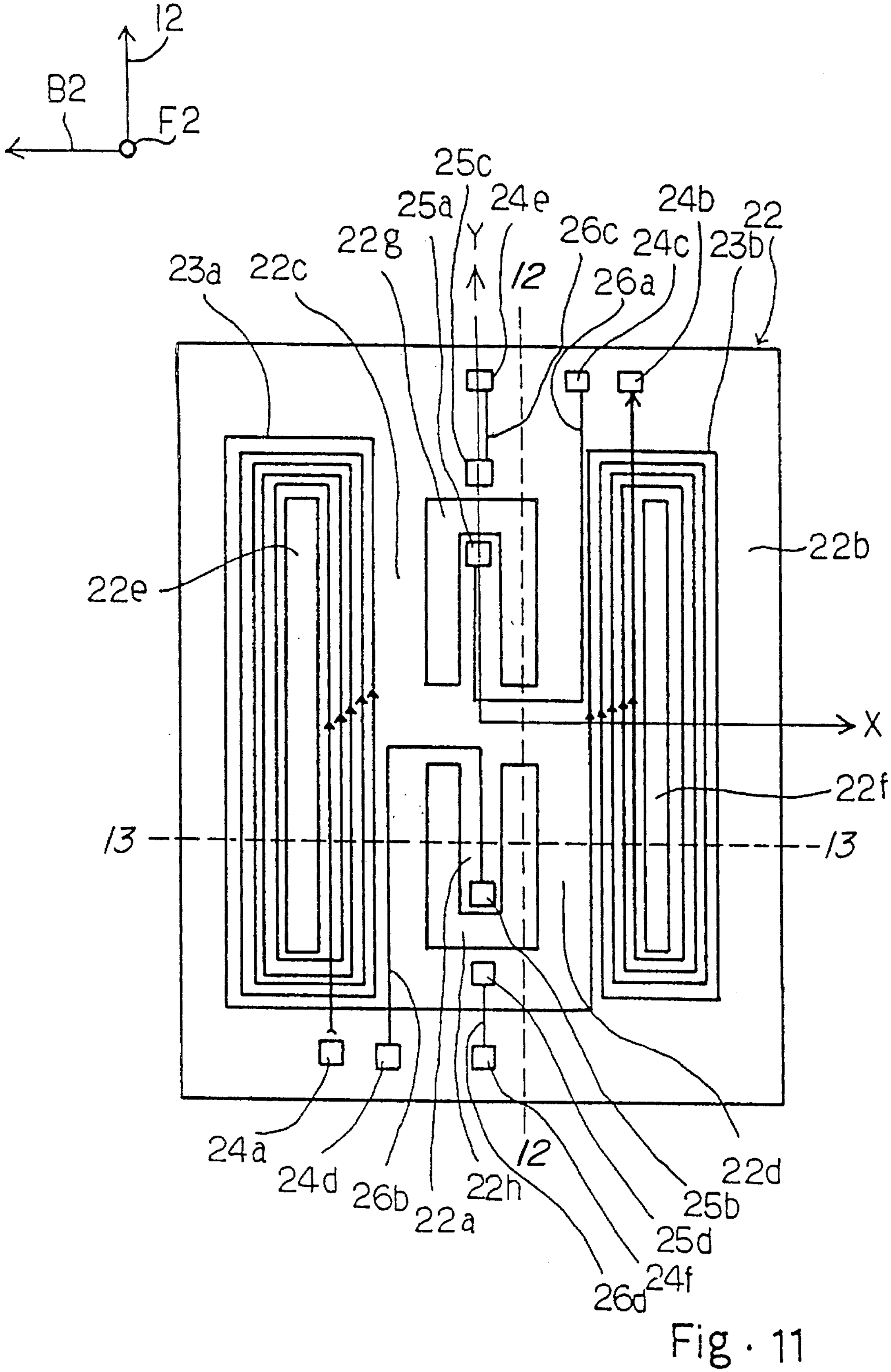
FIG. 11 is a plan view showing the layout of a first semiconductor substrate incorporated in another semiconductor relay unit.
Figure 12:
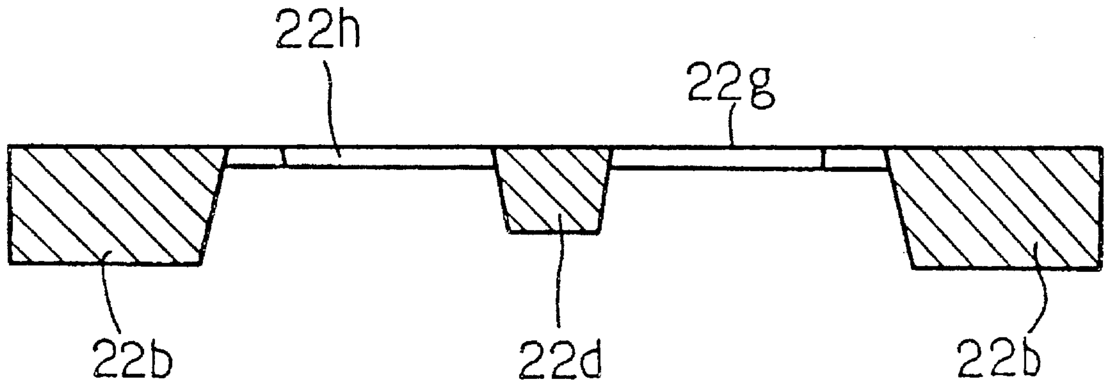
FIG. 12 is a cross sectional view taken along line C—C of FIG. 11 and showing the structure of the first semiconductor substrate.
Figure 13:
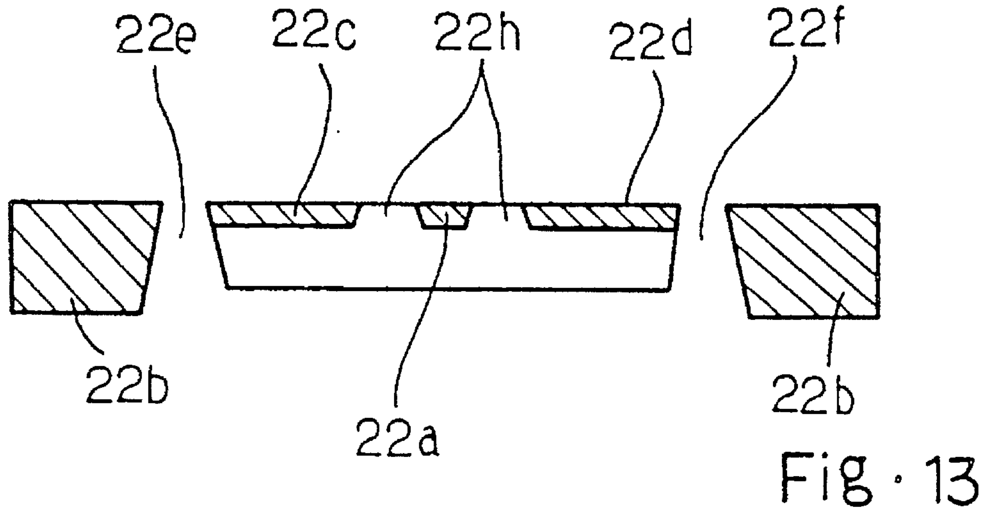
FIG. 13 is a cross sectional view taken along line D—D of FIG. 11 and showing the structure of the first semiconductor substrate at another angle.

As shown in FIGS. 11 to 13, the first semiconductor substrate 22 is rectangular, and further has a peripheral frame portion 22*b* and deformable beam portions 22*c* and 22*d* between the movable center portion 22*a* and the peripheral frame portion 22*b*. The deformable beam portions 22*c* and 22*d* are thinner than the movable center portion 22*a*. Slits 22*e*, 22*f*, 22*g* and 22*h* define the peripheral frame portion 22*b*; the deformable beam portions 22*c* and 22*d* and the movable center portion 22*a*, and the first semiconductor substrate 22 are formed through an anisotropical etching process.

Coil members 23*a* and 23*b* are formed around the slits 22*e* and 22*f*, and are partially on the deformable beam portions 22*c* and 22*d*. The coil members 23*a* and 23*b* are coupled in series, and the series of coil members 23*a* and 23*b* are connected at both ends to bonding pads 24*a* and 24*b*. Moving contacts 25*a* and 25*b* are formed on the movable center portion 22*a*, and are connected through wirings 26*a* and 26*b* to bonding pads 24*c* and 24*d*. First intermediate contacts 25*c* and 25*d* are connected through wirings 26*c* and 26*d* to bonding pads 24*e* and 24*f*, and are held in contact with second intermediate pads (not shown) formed on the second semiconductor substrate 23. The second intermediate pads are connected through wirings (not shown) to fixed contacts (not shown) on the second semiconductor substrate as similar to the first embodiment.

The coil members 23*a* and 23*b*, the moving, fixed and intermediate contacts 25*a* to 25*d*, the wirings 26*a* to 26*d* and the bonding pads 24*a* to 24*f* are as similar to those of the first embodiment, and the bonding pads 24*a* to 24*f* are connected through bonding wires (not shown) to the lead frame 21.

The permanent magnet blocks 24*a* and 24*b* create magnetic field in parallel to the coil members 23*a* and 23*b* and in the X-direction. When current I2 flows from the bonding pad 24*a* though the coil members 23*a* and 23*b* to the bonding pad 24*b* and magnetic fields created by the parmanent magnets are in a direction B2, magnetic forces F2 are produced in a direction F2. The magnetic force produced by the coil member 23*a* is identical in the direction with the magnetic force produced by the coil member 23*b*. As a result, the movable center portion 22*a* is upwardly moved as shown in FIG. 10, and the moving contacts 25*a* and 25*b* selectively come into contact with the fixed contacts on the second semiconductor substrate 23.

If the current is cut off, the magnetic forces F2 are removed, and the movable center portion 22*a* returns to the initial position due to the elasticity of the deformable beam portions 22*c* and 22*d*.

Third Embodiment

Figure 14:
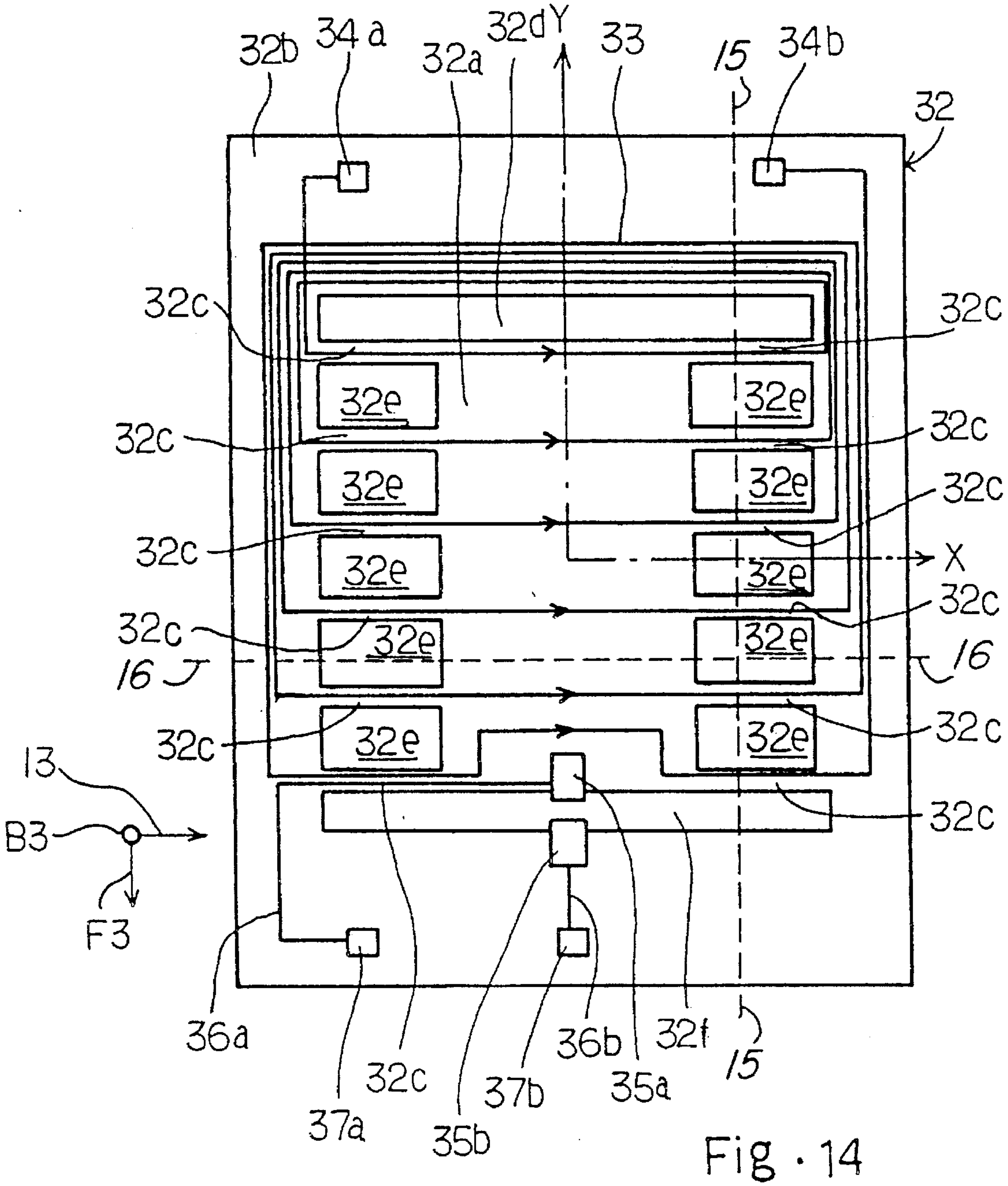
FIG. 14 is a plan view showing the structure of yet another semiconductor relay unit according to the present invention.
Figure 15:
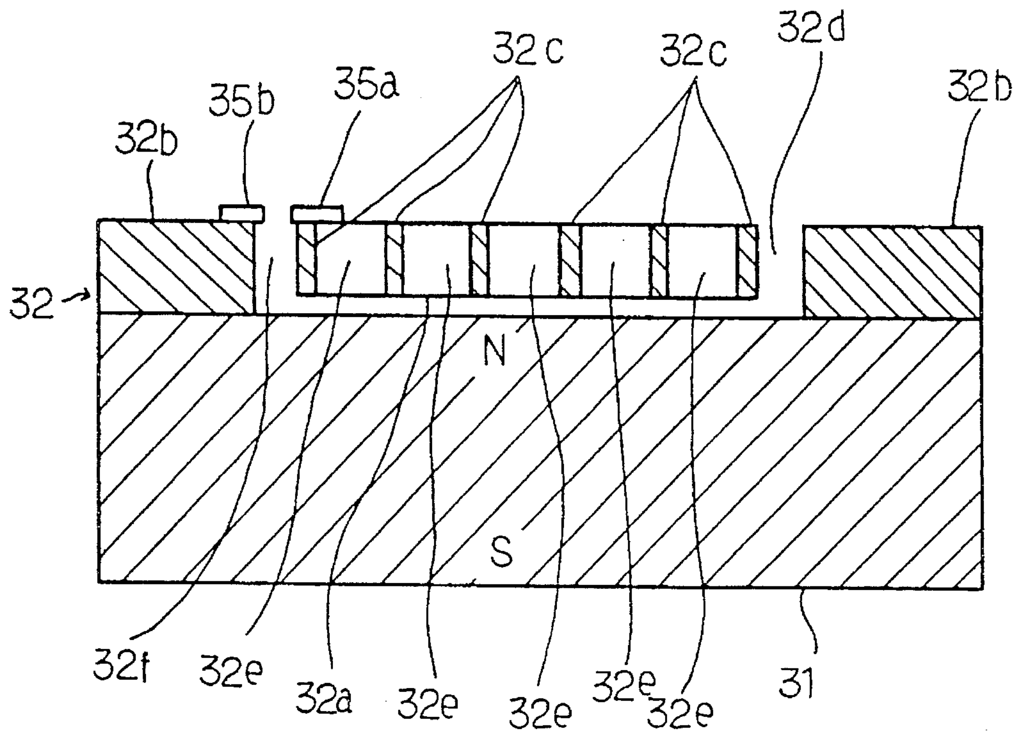
FIG. 15 is a cross sectional view taken along line E—E of FIG. 14 and showing the structure of the semiconductor relay unit.
Figure 16:
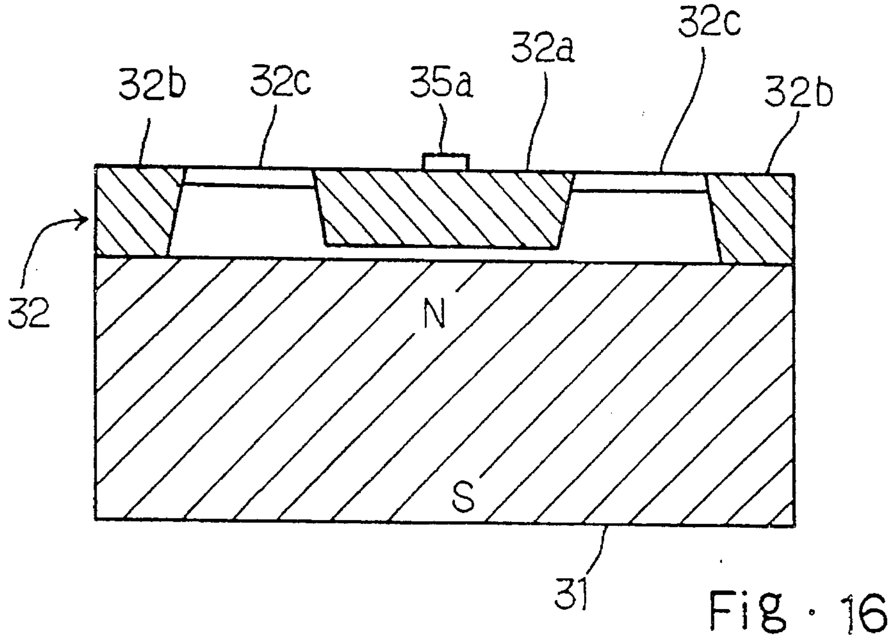
FIG. 16 is a cross sectional view take along line F—F of FIG. 14, and showing the structure of the semiconductor relay unit at different angle.

Turning to FIGS. 14 to 16 of the drawings, yet another semiconductor relay unit embodying the present invention comprises a permanent magnet block 31 and a semiconductor substrate 32 bonded to the permanent magnetic block 31. Though not shown in the figures, the permanent magnet block 31 and the semiconductor substrate 32 are sealed in a package.

The semiconductor substrate 32 has a movable center portion 32*a*, a peripheral frame portion 32*b* and a plurality of deformable beam portions 32*c*, and slits 32*d*, 32*e* and 32*f* define the movable center portion 32*a*, the peripheral frame portion 32*b* and the deformable beam portions 32*c*. A coil member 33 is formed on the semiconductor substrate 32, and successively passes through the deformable beam portions 32*c*, and is connected at both ends to bonding pads 34*a* and 34*b*. The movable center portion 32*a*, the peripheral frame portion 32*b* and the deformable beam portions 32*c* are formed by using an anisotropic etching technique.

A moving contact 35*a* and a fixed contact 35*b* partially project into the slit 32*f*, and are confronted to one another. The moving contact 35*a* and the fixed contact 35*b* are connected through wirings 36*a* and 36*b* to bonding pads 37*a* and 37*b*, and the coil member 33, the moving and fixed contacts 35*a* and 35*b*, the wirings 36*a* and 36*b* and the bonding pads 37*a* and 37*b* are formed as similar to those of the first embodiment.

The permanent magnet block 31 creates magnetic field in perpendicular to the coil member 33. When current I3 flows from the bonding pad 34*a* through the coil member 33 to the bonding pad 34*b*, magnetic force F3 is produced in parallel to Y axis, and the moving contact 35*a* is brought into contact with the fixed contact 35*b*. On the other hand, if the current I3 is cut off, the elasticity of the deformable beam portions 32*c* cause the movable center portion 32*a* to return to the initial position, and the moving contact 35*a* is spaced from the fixed contact 35*b*.

As will be appreciated from the foregoing description, the semiconductor relay unit according to the present invention is fabricated by using the semiconductor technologies, and are smaller in size and lower in cost than the prior art miniature relay unit.

Although particular embodiments of the present invention have been shown and described, it will be obvious to those skilled in the art that various changes and modifications may be made without departing from the spirit and scope of the present invention. For example the number of pairs of moving and fixed contacts is arbitrary. A semiconductor relay unit according to the present invention may have only one pair of moving and fixed contacts, and more than two pairs of moving/fixed contacts may be incorporated in another semiconductor relay unit.

What is claimed is:

1. A semiconductor relay unit comprising:

a first semiconductor substrate having a stationary portion of a semiconductor material and a movable portion of said semiconductor material movable with respect to said stationary portion, said stationary portion forming a part of a stationary structure stationary with respect to said movable portion;

a coil means at least a part of which is formed on said movable portion;

a moving contact means formed on said movable portion;

a fixed contact portion provided on said stationary structure and associated with said moving contact means;

a magnetic means provided on said stationary structure, and creating a magnetic field around said coil means; and a current supplying means for supplying a current to said coil means for exerting a magnetic force on said movable portion, thereby causing said movable portion to move with respect to said stationary portion for bringing said moving contact means into contact with said fixed contact portion.

2. The semiconductor relay unit as set forth in claim 1, in which said fixed contact portion is formed on a second semiconductor substrate laminated on said first semiconductor substrate and forming another part of said stationary structure.

3. The semiconductor relay unit as set forth in claim 2, in which said movable portion has deformable sub-portions connected between a central sub-portion of said movable portion and said stationary portion provided around said movable portion, said coil means being looped along a periphery of said central sub-portion, said moving contact means being provided on one of said deformable sub-portions, said magnetic means and a current flowing through said coil means being operative to produce a torque exerted on said movable portion so that said moving contact means on said movable portion of said first semiconductor substrate comes into contact with said fixed contact portion on said second semiconductor substrate through a torsion produced in said deformable sub-portions.

4. The semiconductor relay unit as set forth in claim 2, in which said movable portion has a pair of deformable sub-portions connected between a central sub-portion of said movable portion and said stationary portion provided around said movable portion, said coil means having a first coil looped partially on a first sub-area of said stationary portion and partially on one of said deformable sub-portion and a second coil connected to said first coil and looped partially on a second sub-area of said stationary portion and partially on the other of said deformable sub-portions, said moving contact means being provided on said central sub-portion, said magnetic means and a current flowing through said first and second coils being operative to produce a force lifting said central sub-portion over said stationary portion so that said moving contact means on said movable portion of said first semiconductor substrate comes into contact with said fixed contact portion on said second semiconductor substrate through bending of said deformable sub-portions.

5. The semiconductor relay unit as set forth in claim 1, in which said movable portion has a plurality of deformable sub-portions connected between a central sub-portion of said movable portion and said stationary portion provided around said movable portion, said coil means being partially looped on said stationary portion and successively passing through said plurality of deformable sub-portions and said central sub-portion, said moving contact means being provided on said central sub-portion, said magnetic means and a current passing through said coil means being operative to produce a force exerted on said movable portion so that said movable contact means on said movable portion comes into contact with said fixed contact portion on said stationary structure through bending of said plurality of deformable sub-portions.

6. A semiconductor relay unit comprising:

a first semiconductor substrate having a movable center portion, a pair of deformable beam portions connected to said movable center portion and having respective center axes aligned with one another, one of said deformable beam portions having a wide sub-portion wider than a remaining sub-portion, and a stationary frame portion provided around said movable center portion and connected to said pair of deformable beams;

moving contacts formed on said deformable beam portion having said wide sub-portion;

a coil formed on said movable center portion;

a lead frame for mounting said first semiconductor substrate and connected through wirings to said coil and said moving contacts;

a second semiconductor substrate laminated on said first semiconductor substrate;

fixed contacts formed on said second semiconductor substrate and confronted with said moving contacts, respectively, said fixed contacts being electrically connected to said lead frame; and permanent magnet means provided on said lead frame on both sides of said first and second semiconductor substrates, said permanent magnet means and a current flowing said coil producing a torque exerted on said movable center portion so that said pair of deformable beam portions rotates around said center axes, thereby allowing one of said moving contacts to come into contact with one of said fixed contacts.

7. A semiconductor relay unit comprising:

a first semiconductor substrate having a stationary frame portion, a movable center portion provided inside of said stationary frame portion, a first deformable beam portion having both end sub-portions connected to said stationary frame portion, a first side sub-portion spaced from a first sub-portion of said stationary frame portion by a first slit formed in said first substrate and a second side sub-portion partially connected to said movable center portion and partially spaced from said movable center portion by second and third slits formed in said first substrate, and a second deformable beam portion provided on the opposite side of said movable center portion to said first deformable beam portion, and having both end sub-portions connected to said stationary frame portion, a first side sub-portion spaced from a second sub-portion of said stationary frame portion by a fourth slit formed in said first substrate and a second side sub-portion partially connected to said movable center portion and partially spaced from said movable center portion by said second and third slits;

a first coil looped around said first slit in such a manner as to pass partially on said first sub-portion of said stationary frame portion and partially on said first deformable beam portion;

a second coil connected in series to said first coil, and looped around said fourth slit in such a manner as to pass partially on said second sub-portion of said stationary frame portion and partially on said second deformable means portion;

a moving contact means formed on said movable center portion;

a lead frame mounting said first semiconductor substrate;

a second semiconductor substrate laminated on said first semiconductor substrate;

a fixed contact means formed on a surface of said second semiconductor substrate in spacing relation with said moving contact means; and permanent magnet means provided on said lead frame on both sides of said first and second semiconductor substrates, said permanent magnet means and a current passing through said first and second coils producing a force for lifting said movable center portion toward said second semiconductor substrate so that said moving contact means comes into contact with said fixed contact means.

8. A semiconductor relay unit comprising:

a semiconductor substrate having a stationary frame portion, a movable center portion provided inside of said stationary frame portion and having first and second end sub-portions spaced from first and second sub-portions of said stationary frame portion by a first slit and a second slit, respectively, a plurality of first deformable beam portions connected between a first side sub-portion of said movable center portion and said stationary frame portion at intervals, and a plurality of second deformable beam portions connected between a second side sub-portion of said movable center portion and said stationary frame portion at intervals;

a moving contact means provided on the first end sub-portion of said movable center portion and partially projecting into said first slit;

a fixed contact means provided on the first sub-portion of said stationary frame portion and partially projecting into said first slit in opposing relation with said moving contact means;

a coil passing through said second sub-portion of said stationary frame, said plurality of first deformable beam portions, said plurality of second deformable beam portions and said movable center portion; and a permanent magnet provided beneath said semiconductor substrate, said permanent magnet and a current passing through said coil producing a force for bending said plurality of first deformable beam portions and said plurality of second deformable beam portions toward said first sub-portion of said stationary frame portion, thereby allowing said moving contact means to come into contact with said fixed contact means.

9. A semiconductor miniature relay unit fabricated by etching silicon substrates, comprising:

a movable contact substrate having a movable coil portion having one of a part of a spiral coil and all of said spiral coil formed on a surface thereof, movable spring portions connected to said movable coil portion for moving together with said movable coil portion and supporting moving contacts wherein wirings connected to said moving contacts are formed thereon, spring portions supporting said movable coil portion and said movable spring portions and allowing wirings to extend thereon for said spiral coil and said moving contacts, and a frame portion connected to said spring portions and having wirings, connecting pads and bonding pads formed thereon;

a fixed contact substrate having fixed contacts opposed to said moving contacts, wirings and connecting pads and bonded to said movable contact substrate;

a permanent magnet block provided in the vicinity of said movable contact substrate and said fixed contact substrate; and a lead frame for mounting said permanent magnet block and a laminated structure of said movable contact substrate and said fixed contact substrate.

* * * * *